US007304360B2

United States Patent
Guo et al.

(10) Patent No.: US 7,304,360 B2
(45) Date of Patent: Dec. 4, 2007

(54) METHOD OF FORMING SUPER-PARAMAGNETIC CLADDING MATERIAL ON CONDUCTIVE LINES OF MRAM DEVICES

(75) Inventors: Yimin Guo, San Jose, CA (US);
Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 11/179,251

(22) Filed: Jul. 12, 2005

(65) Prior Publication Data

US 2007/0014146 A1 Jan. 18, 2007

(51) Int. Cl.
*H01L 29/82* (2006.01)
(52) U.S. Cl. .......................................... 257/422; 438/3
(58) Field of Classification Search ................ 257/422, 257/421, 427; 438/3
See application file for complete search history.

(56) References Cited

U.S. PATENT DOCUMENTS

| 6,525,957 | B1 | 2/2003 | Goronkin et al. | 365/158 |
|---|---|---|---|---|
| 6,720,597 | B2 | 4/2004 | Janesky et al. | 257/295 |
| 6,730,395 | B2 | 5/2004 | Covington | 428/323 |
| 6,844,202 | B2 | 1/2005 | Prinz et al. | 436/526 |
| 2003/0224103 | A1* | 12/2003 | Akinaga et al. | 427/127 |
| 2005/0026308 | A1 | 2/2005 | Ingvarsson et al. | 438/3 |
| 2005/0078511 | A1 | 4/2005 | Parkin | 365/171 |
| 2006/0186495 | A1* | 8/2006 | Rizzo et al. | 257/421 |

OTHER PUBLICATIONS

"A Low Power 1Mbit MRAM based on 1T1MTJ Bit Cell Integrated with Copper Connects", Naji et al., VLSI Conf. (2002) pp. 1-22.

* cited by examiner

*Primary Examiner*—Richard T. Elms
*Assistant Examiner*—Michael Lulis
(74) *Attorney, Agent, or Firm*—Saile Ackerman LLC; Stephen B. Ackerman

(57) ABSTRACT

A super-paramagnetic cladding layer formed on from 1 to 3 sides of a conductive line in a magnetic device is disclosed. The cladding layer is made of "x" ML/SL stacks in which x is between 5 and 50, SL is an amorphous $AlO_x$ seed layer, and ML is a composite with a soft magnetic layer comprised of discontinuous particles less than 2 nm in size on the seed layer and a capping layer of Ru, Ta, or Cu on the soft magnetic layer. Fringing fields and hysteresis effects from continuous ferromagnetic cladding layers associated with switching the magnetic state of an adjacent MTJ are totally eliminated because of the super-paramagnetic character of the soft magnetic layer at room temperature. The soft magnetic layer has near zero magnetostriction, very high susceptibility, and may be made of $Ni_{\sim 80}Fe_{\sim 20}$, $Ni_{\sim 30}Fe_{\sim 70}$, $Co_{\sim 90}Fe_{\sim 10}$, or CoNiFe.

35 Claims, 3 Drawing Sheets

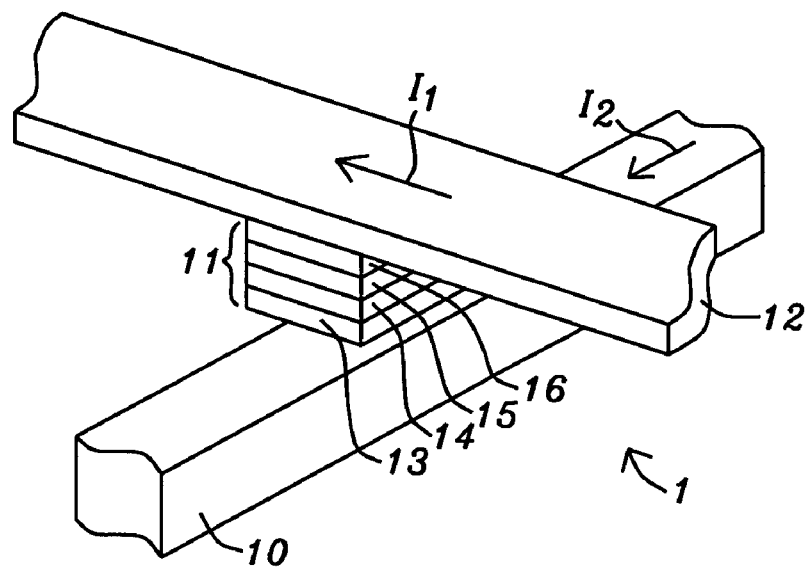
FIG. 1 - Prior Art
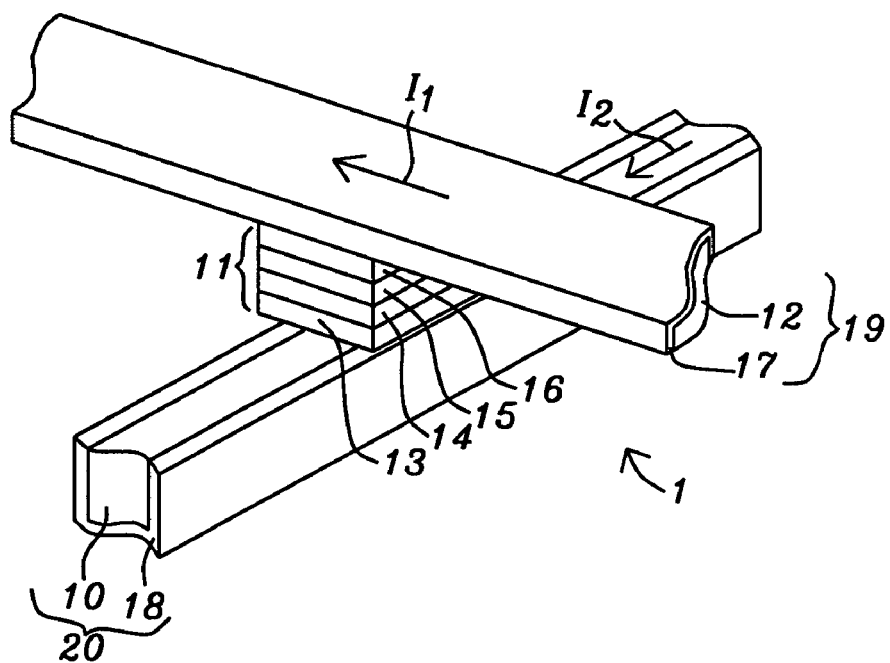
FIG. 2 - Prior Art

US 7,304,360 B2

METHOD OF FORMING SUPER-PARAMAGNETIC CLADDING MATERIAL ON CONDUCTIVE LINES OF MRAM DEVICES

FIELD OF THE INVENTION

The invention relates to an MRAM structure, and more particularly, to a super-paramagnetic cladding layer formed on at least one side of a bit line and/or word line. The super-paramagnetic cladding layer is a composite that has a plurality of soft magnetic layers made of discontinuous ferromagnetic particles formed in a non-magnetic matrix and separated by amorphous oxide layers.

BACKGROUND OF THE INVENTION

Magnetic random access memory (MRAM) that incorporates a magnetic tunneling junction (MTJ) as a memory storage cell is a strong candidate to provide a high density, fast (1-30 ns read/write speed), and non-volatile storage solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and an MTJ formed at each location where a second conductive line crosses over a first conductive line. A first conductive line may be a word line while a second conductive line is a bit line or vice versa. Alternatively, the first conductive line may be a sectioned line which is a bottom electrode or a stud that connects the MTJ to a transistor.

Referring to FIG. 1, a conventional MRAM structure 1 is shown in which an MTJ 11 is formed between a first conductive line 10 and a second conductive line 12. In this example, the first conductive line is a word line and the second conductive line is a bit line although the terms are interchangeable. A conductive line may also be referred to as a digit line, row line, data line or column line. The word line 10 and bit line 12 are used for writing data into the MTJ 11. The MTJ consists of a stack of layers with a configuration in which two ferromagnetic layers are separated by a thin non-magnetic insulating layer such as $Al_2O_3$, $AlN_xO_y$, or MgO which is called a tunnel barrier layer. In a so-called bottom spin valve configuration, the bottom portion 13 is a composite layer with a lower seed layer, a middle anti-ferromagnetic (AFM) layer, and an upper pinned layer. The AFM layer is exchange coupled to the pinned layer and thereby fixes the magnetization (magnetic moment) direction of the pinned layer in a preset direction. Above the pinned layer is the tunnel barrier layer 14. The second ferromagnetic layer is a free layer 15 on the tunnel barrier layer and has a magnetization direction which can be changed by external magnetic fields. To maintain data against erasure or thermal agitation, an in-plane uni-axial magnetic anisotropy is needed for the magnetic free layer 15. The top layer in the MTJ 11 is generally a cap layer 16.

In a read operation, the information is read by sensing the magnetic state (resistance level) of the MTJ through a sense current flowing through the MTJ, typically in a current perpendicular to plane (CPP) configuration. When the magnetic vector of the free layer 15 is oriented parallel to that of the pinned layer, there is a lower resistance for current passing through the tunnel barrier layer 14 than when the free layer and pinned layer have magnetic vectors in anti-parallel directions.

During a write operation, an electrical current $I_1$ in bit line 12 and a current $I_2$ in word line 10 yield two magnetic fields on the free layer 15. The magnetic fields conform to a right hand rule so that a first field is generated along a first axis (easy axis) in the plane of the free layer and a second field is produced in a direction orthogonal to the first axis (hard axis) in the free layer. In response to the magnetic fields generated by currents $I_1$ and $I_2$, the magnetic vector in the free layer is oriented in a particular stable direction. The resulting magnetic vector orientation depends on the direction and magnitude of $I_1$ and $I_2$ and the properties and shape of the free layer 15. Generally, writing a zero (0) requires the direction of either $I_1$ or $I_2$ to be different than when writing a one (1).

The magnitude of the magnetic field used to switch the magnetic vector is proportional to the magnitude of $I_1$ and $I_2$. The amplitude of $I_1$ and $I_2$ is on the order of several milli-Amperes for most designs. It is desirable to reduce power consumption and this adjustment is achieved in some cases by increasing the field per current ratio of the conductor. A prior art method for increasing the field per current ratio is to provide a cladding layer on one or more sides of a conductive line. Examples of cladding layers are described by Naji et al. in "A low power 1 Mbit MRAM based on 1T1MTJ bit cell integrated with Copper Interconnects", VLSI Conf. (2002).

Ferromagnetic cladding layers are known to increase the current induced magnetic switching field applied to magnetic elements such as MTJs configured either above or below a metal line having such a cladding layer and thereby reduce the current necessary to produce a switching field. As a result, switching word line transistors can also be made smaller. As the size of MTJs shrinks to 0.1 micron or smaller, the switching fields are expected to become larger and switch transistors will demand a larger amount of chip area.

Referring to FIG. 2, a conventional MRAM 1 with a magnetic cladding design is shown in which a word line 19 is comprised of two parts that are an electrically conductive inner core 10 such as Cu and a soft magnetic cladding layer 17. Likewise, a bit line 20 may be comprised of a copper inner core 12 and a soft magnetic cladding layer 18 formed thereon. The cladding layers are used to focus the magnetic flux associated with $I_1$ and $I_2$ onto MTJ 11 and reduce the magnetic field on the conductive line surfaces which are not facing the MTJ. Ferromagnetic cladding layers are typically made by forming a ferromagnetic layer on one or more sides of a metal line. Note that the cladding layers 17, 18 are not formed on a side of a conductive line that faces the MTJ 11. The magnetization of the cladding layers 17, 18 are along the long axis of the lines 19, 20, respectively, thereby creating poles at both ends of the lines. The fringing field at such poles can reach 50 to 300 Gauss in magnitude. The size of the fringing field means that MTJs should be spaced some distance from the line ends in order not to shift the switching point of the MTJs. However, when the spacing between MTJs and line ends is increased to several microns to prevent fringing field effects, the chip layout does not satisfy the density requirement of advanced memory designs.

Ferromagnetic dadding layers can also show a hysteresis effect as a result of certain current directions in the lines 19, 20. Moreover, domain effects in a ferromagnetic cladding layer can cause a partial local switching of the ferromagnetic cladding layer when a current is passed through the lines 19, 20. The write margin significantly decreases because partial switching widens the switching field distribution for an MTJ. Therefore, fringing fields and hysteresis effects must be substantially reduced or eliminated to enable higher performance in state of the art memory chips with densely packed magnetic elements.

An interconnect is clad on three sides with multiple magnetic layers in U.S. Pat. No. 6,720,597. There is a spacer layer formed between each adjacent ferromagnetic layer to reduce the presence of domains and decrease hysteresis. However, the ferromagnetic layers are uniform, continuous, and have magnetic domain structures that produce stray fields that cannot be totally eliminated.

In U.S. Pat. No. 6,525,957, a ferromagnetic cladding layer comprised of $Ni_{80}Fe_{20}$ is formed on three sides of a conductive line. Alternatively, the cladding layer can be at only one side or at two continuous or discontinuous sides. Multi-state memory layers that preferably have no ends are employed to eliminate variations resulting from end-domain nucleations and to eliminate shape sensitivity during memory state switching.

A magnetic sensor is described in U.S. Pat. No. 6,844,202 wherein a sensing element detects the presence of magnetic particles in a binding assay. When a magnetic particle becomes immobilized relative to the magnetic sensor, the radial fringing field of the magnetic particle causes the magnetic moment of at least one layer of ferromagnetic material to shift from circular to radial and cause a detectable change in electrical resistance.

A MTJ is disclosed in U.S. Pat. No. 6,730,395 in which a hard layer of a device is made of nanoparticles that are separated by an insulating barrier comprised of a carbon-based coating. The free layer is formed on the insulating barrier. In this case, the nanoparticles are required to remain ferromagnetic to maintain a magnetic moment.

In U.S. Patent Application 2005/0026308, a magnetic liner is formed with super-paramagnetic properties to eliminate fringing fields and hysteresis effects. Ferromagnetic films are made from ferromagnetic particles about 10 nm in size and are separated from one another by a polymer, non-magnetic metal, or an oxide.

U.S. Patent Application 2005/0078511 describes a system that utilizes the inherent properties of domain walls in ferromagnetic materials to write data on an unpatterned magnetic film. Domain wall fringing fields provide highly localized and large magnetic fields that are manipulated in space by controlling the position of the domain wall.

SUMMARY OF THE INVENTION

One objective of the present invention is to provide a super-paramagnetic cladding layer for conductive lines in an MRAM array to prevent fringing fields and hysteresis effects that are associated with switching the magnetic state in adjacent MTJs.

A further objective of the present invention is to provide a reproducible and cost effective method of forming a super-paramagnetic cladding layer with very high susceptibility according to the first objective.

These objectives are achieved in an MRAM structure comprised of an MTJ and at least one conductive line formed proximate to the MTJ. In one aspect, there is a bit line having a side that contacts the bottom (or top) surface of the MTJ and a word line aligned orthogonally to the bit line that has a side which contacts the top (or bottom) surface of the MTJ. A key feature is that a super-paramagnetic cladding layer is formed on one or more sides of the bit line and/or word line that do not contact the MTJ. In other words, the super-paramagnetic cladding layer may be formed on a minimum of one side, two sides, or on a maximum of three sides of a conductive line. When two sides of the bit line and/or word line are covered by the cladding layer, the sides may be opposite one another or adjacent to each other. The super-paramagnetic cladding layer is a composite having a $[ML/SL]_x$ configuration wherein x is an integer from 5 to 50, ML is comprised of a thin, soft magnetic layer made of discontinuous particles that are separated and covered by a capping layer, and SL is a seed layer that is preferably an oxide such as $AlO_x$. In one embodiment, the soft magnetic layer has near zero magnetostriction and is preferably particles of NiFe having a Ni content of about 80 atomic %, NiFe having a Ni content of about 30 atomic %, CoFe having a Co content of about 90 atomic %, or combinations thereof. The soft magnetic layer has a thickness less than 2 nm and is super-paramagnetic at room temperature. The capping layer has a thickness of 0.5 to 5 nm and is preferably comprised of Ru, Ta, or Cu.

In the preferred embodiment, an $AlO_x$ seed layer is formed directly on a substrate by a sputter deposition method or by sputter depositing Al followed by a plasma, radical, or natural oxidation process. The substrate may be a dielectric layer in which a trench has been formed to contain a subsequently deposited first conductive line. After the $AlO_x$ seed layer is deposited, a soft magnetic layer is formed on the $AlO_x$ layer by a plasma enhanced chemical vapor deposition (PECVD) or ion beam deposition (IBD) method, for example. Then a capping layer is deposited on the magnetic layer by a chemical vapor deposition (CVD), physical vapor deposition (PVD), PECVD, IBD, or sputter deposition process. The aforementioned process sequence involving three steps is repeated a plurality of "x" times until the desired thickness of the super-paramagnetic cladding layer is achieved. Thereafter, in an embodiment where the cladding layer is formed in a trench within a substrate, a first conductive line is formed in which three sides contact the super-paramagnetic cladding layer. Optionally, a diffusion barrier layer may be deposited on the super-paramagnetic cladding layer prior to forming the first conductive line to prevent metal in the first conductive line from migrating into the cladding layer. An MTJ may then be fabricated by a conventional process on the side (top surface) of the first conductive line not contacting the cladding layer.

In another embodiment, a second conductive line may be formed on the MTJ and within a second dielectric layer by a well known method such that one side of the second conductive line contacts the top surface of the MTJ. According to one aspect, a second super-paramagnetic cladding layer may be formed on one to three remaining sides of the second conductive line by a sequence similar to that described above.

BRIEF DESCRIPTION OF THE DRAWINGS

FIG. 1 is a cross-sectional view showing a conventional MRAM structure in which an MTJ is formed between a first conductive line and a second conductive line.

FIG. 2 is a cross-sectional view of the MRAM in FIG. 1 that has been modified with a magnetic cladding layer on three sides of the first and second conductive lines.

DETAILED DESCRIPTION OF THE INVENTION

Figure 3:
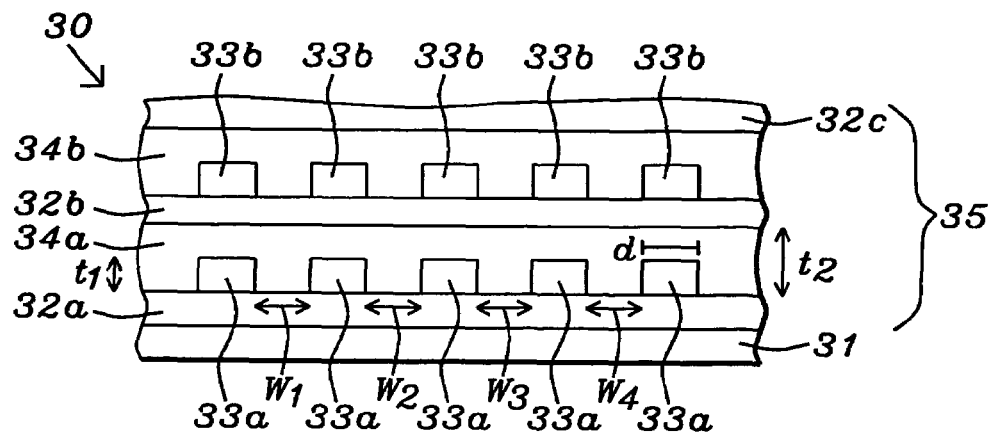
FIG. 3 is a cross-sectional view of a super-paramagnetic cladding layer formed on a substrate according to one embodiment of the present invention.

The present invention is an MRAM structure having a super para-magnetic cladding layer disposed on at least one side of a conductive layer formed proximate to an MTJ such that a cladded side does not contact the MTJ. The super-paramagnetic cladding layer is a composite with a $[ML/SL]_x$ configuration wherein SL is a seed layer, ML is a composite comprised of a soft magnetic layer in the form of discontinuous particles that are super para-magnetic at room temperature and are separated by an overlying capping layer, and x is an integer between 5 and 50. The drawings are provided by way of example and are not intended to limit the scope of the invention. Although certain drawings depict a bit line formed below a MTJ and a word line above the MTJ, the designation for bit line and word line may be reversed. Note that the terms bit line and word line may be interchanged with other terms such as column line, row line, data line, and digit line and that the MTJ may be a top MTJ, a bottom MTJ, or a dual MTJ as appreciated by those skilled in the art. Although only one MRAM cell is shown in the drawings, it should be understood that there are a plurality of MRAM cells in an array that has multiple rows and columns on an MRAM chip. The present invention is also a method of forming one or more of the super-paramagnetic cladding layers described herein.

Referring to FIG. 3, a portion of an MRAM structure 30 in an MRAM chip is shown that includes a substrate 31 which in the exemplary embodiment is a dielectric layer formed on a substructure (not shown) comprised of silicon or another semiconductor material used in the art. In one aspect, the substrate 31 represents the bottom of a trench 45 (FIG. 4) that defines the shape of a subsequently deposited conductive line 41 and the multilayer structure 35 is a super-paramagnetic cladding layer used to line the bottom and sides of the trench. Alternatively, the super-paramagnetic cladding layer 35 may cover only the bottom of the trench 45 or one of the sides. In yet another embodiment, the super-paramagnetic cladding layer 35 may cover the two sides of the trench 45 or a side and a bottom. Optionally, a diffusion barrier layer (not shown) may be formed between the super-paramagnetic cladding layer 35 and the conductive line 41 to prevent metal from diffusing into the cladding layer. The conductive line 41 may be a bit line, word line, or sectioned line (bottom electrode).

A key feature of the present invention is the configuration of the super-paramagnetic cladding layer 35 which has a plurality of "x" ML/SL stacks wherein x is an integer between about 5 and 50, ML is a composite comprised of a soft magnetic layer made of discontinuous particles with a thickness and diameter of about 2 nm or less and a capping layer that separates and covers the soft magnetic layer, and SL is a seed layer that is preferably an oxide such as $AlO_x$ which has a stoichiometry close to that of $Al_2O_3$. In the exemplary embodiment wherein the first ML/SL stack has a seed layer 32a formed on the substrate 31, the seed layer 32a is preferably $AlO_x$ with a thickness from about 0.8 to 10 nm and is advantageously amorphous to promote the formation of discontinuous ferromagnetic particles in the overlying ML layer. Optionally, another amorphous oxide may be used as the seed layer 32a. The ML layer in the first ML/SL stack is comprised of a soft magnetic layer 33a that has a thickness $t_1$ and a diameter d, and a capping layer 34a having a thickness $t_2$ above the seed layer 32a. The values $t_1$ and d are not necessarily the same magnitude but in general have essentially the same size. Note that the spacing between adjacent particles in the soft magnetic layer 33a is shown as $W_1$, $W_2$, $W_3$, $W_4$, and so forth to point out that the values $w_1$, $w_2$, $w_3$, $w_4$ are not necessarily equal. The values $w_1$-$w_4$ may be less than d but are preferably greater than 0. The thickness $t_1$ is intentionally maintained at 2 nm or less to prevent one or more of $w_1$-$w_4$ from becoming zero which results in conglomerates of particles or a continuous film.

In one embodiment, the soft magnetic layer 33a has near zero magnetostriction, small magnetic anisotropy, and is preferably particles of NiFe having a Ni content of about 80 atomic % (hereafter referred to as $Ni_{\sim 80}Fe_{\sim 20}$), NiFe having a Ni content of about 30 atomic % (hereafter referred to as $Ni_{\sim 30}Fe_{\sim 70}$), CoFe having a Co content of about 90 atomic % (hereafter referred to as $Co_{\sim 90}Fe_{\sim 10}$), or combinations thereof. For example, $Co_R Ni_S Fe_T$ may be used as the soft magnetic layer 33a wherein R, S, and T are the atomic % of Co, Ni, and Fe, respectively, R+S+T=100 and R, S, and T are chosen to have near zero magnetostriction. The discontinuous particles in the soft magnetic layer 33a ensure a super para-magnetic behavior at room temperature rather than a ferromagnetic character exhibited by a continuous film. In other words, the discontinuous particles have a non-exchange coupled microstructure with sufficiently small micro domains such that their energy content is comparable to kT or up to 5 kT where k is the Bolzmann constant and T is temperature. It is believed that the super-paramagnetic behavior exists in the soft magnetic layer 33a at a temperature above −30° C.

Capping layer 34a is preferably comprised of Ru, Ta, or Cu and the thickness $t_2$ is about 0.5 to 5 nm. Note that the thickness $t_2$ is always greater than $t_1$. The capping layer 34a is non-magnetic and serves to stabilize the magnetic and thermal properties of the underlying super-paramagnetic layer 33a. Preferably, the capping layer 34a is formed with a substantially flat top surface which is defined as the surface opposite that of the seed layer 32a.

A second ML/SL stack is formed on the top surface of the capping layer 34a in the first ML/SL stack and is comprised of a lower seed layer 32b, a soft magnetic layer 33b, and an upper capping layer 34b that covers and separates the discontinuous particles in the soft magnetic layer 33b. In one embodiment, the seed layer 32b, soft magnetic layer 33b, and capping layer 34b have the same composition and properties as the seed layer 32a, soft magnetic layer 33a, and capping layer 34a, respectively. Optionally, the soft magnetic layer 33b may be different than the soft magnetic layer 33a. For example, the soft magnetic layer 33a may be comprised of NiFe and the soft magnetic layer 33b may be made of CoFe. It should be understood that there may be slight variations in thickness between particles in the soft magnetic layers 33a, 33b. Furthermore, the capping layer 34b may have a different thickness and/or composition than that of capping layer 34a. Likewise, the seed layer 32b may have a different thickness and/or composition than that of seed layer 32a.

Only two complete ML/SL stacks and a portion of a seed layer 32c in the third ML/SL stack are shown in FIG. 3 in order to simplify the drawing. According to the present invention, a total of at least five ML/SL stacks are preferably formed on the substrate 31. Note that the bottom seed layer in the second stack and subsequent stacks is formed on the top surface of the capping layer in the previous stack and the uppermost layer in the super-paramagnetic cladding layer 35 is a capping layer (not shown). The thickness of the super-paramagnetic cladding layer 35 is preferably in the range of 10 to 150 nm. It should be understood that there may be variations in thickness and composition among the plurality of "x" ML layers in the super-paramagnetic cladding layer 35. For example, a first seed layer may have a different thickness and/or composition than that of a second seed layer. Similarly, a first ML layer may have a different thickness and/or composition than that of a second ML layer.

Figure 4:
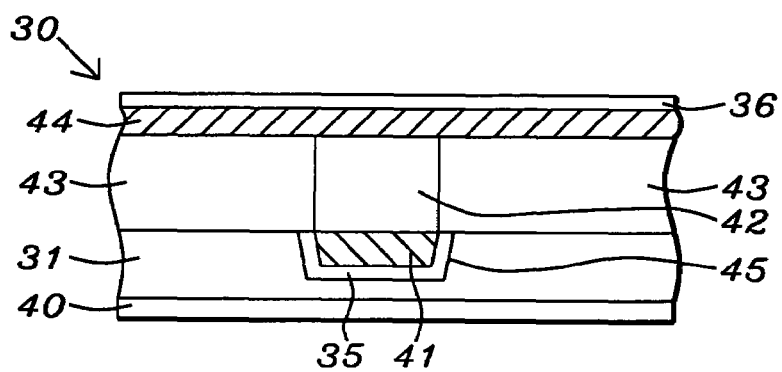
FIG. 4 is a cross-sectional view of an MRAM structure in which a bit line and word line each have three sides covered by a super-paramagnetic cladding layer according to one embodiment of the present invention.
Figure 5:
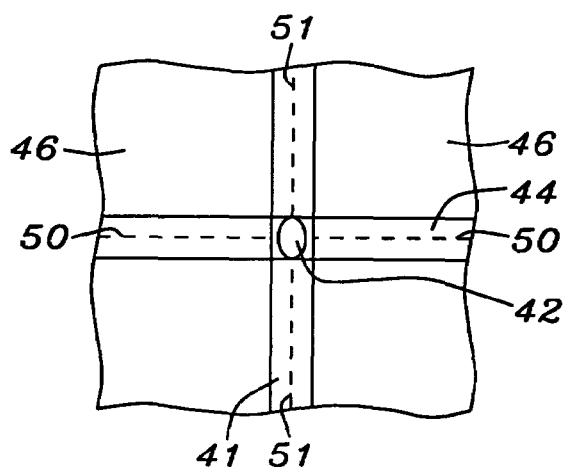
FIG. 5 is a top view of the MRAM structure in FIG. 4 that shows an elliptically shaped MTJ between a bit line and word line that have a super-paramagnetic cladding layer according to one embodiment of the present invention.

Referring again to FIG. 4, the MRAM structure 30 has an MTJ 42 formed on the side (upper surface) of the first conductive line 41 that is essentially coplanar with the dielectric layer 31 disposed on a substructure 40 as mentioned earlier. The first conductive line 41 is formed in a trench 45 in the dielectric layer 31. Note that the cross-sectional view in FIG. 4 is obtained by a cross-section along the axis 50-50 (FIG. 5). The MTJ 42 is typically formed within and is essentially coplanar with a dielectric layer 43. The actual layers within MTJ 42 are not shown but are configured to provide a magnetoresistive effect. There is a second conductive line 44 on the MTJ 42 that is aligned orthogonally to the first conductive line 41. The present invention encompasses an embodiment wherein the second conductive line 44 does not have a cladding layer.

In another embodiment, a second super-paramagnetic cladding layer 36 is formed on at least one side of the second conductive line 44 that does not contact the MTJ 42. Preferably, the second super-paramagnetic cladding 36 layer has the same composition as the first super-paramagnetic cladding layer 35. Optionally, the number of ML/SL stacks in the two cladding layers 35, 36 may differ. In another embodiment, the thickness and/or composition of the ML and SL layers in the first super-paramagnetic cladding layer 35 may differ from those in the second super para-magnetic cladding layer 36. The present invention also encompasses other embodiments in which a super-paramagnetic cladding layer is formed on the second conductive line 44 but not the first conductive line 41. First and second conductive lines 41, 44 are typically comprised of Cu or another electrically conductive material used in the art.

Referring to FIG. 5, a top view of the MRAM structure 30 in FIG. 4 shows the MTJ 42 is elliptical in shape although another anisotropic shape such as a diamond, eye, or rectangle is acceptable. The long axis of the MTJ 42 in this case is aligned with the axis 51-51 that is in turn parallel to the lengthwise dimension of the first conductive line 41. The short axis of the MTJ is aligned along the axis 50-50 which is parallel to the lengthwise dimension of the second conductive line 44.

Figure 6:
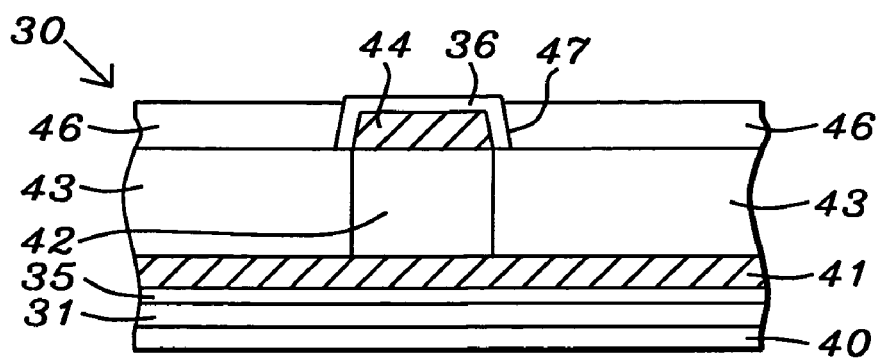
FIG. 6 is a cross-sectional view obtained by a cross-section along the axis 51-51 in FIG. 5

Referring to FIG. 6, the second conductive line 44 is formed on the top surface of the MTJ 42 and within a dielectric layer 46 that is disposed on the dielectric layer 43. A second super-paramagnetic cladding layer 36 is shown on the three sides of the second conductive line that do not contact the MTJ 42. Alternatively, a diffusion barrier layer (not shown) may be formed between the second conductive line 44 and the second super-paramagnetic cladding layer 36. Moreover, the second super-paramagnetic cladding layer 36 may be formed only on the top surface or on one side of the second conductive line 44. Optionally, the second super-paramagnetic cladding layer 36 may be formed on the top surface and one side or on opposite sides of the second conductive line 44 and has a top surface about coplanar with the dielectric layer 46. A method of forming the cladding layers 35, 36 will be described in a later section.

Figure 7:
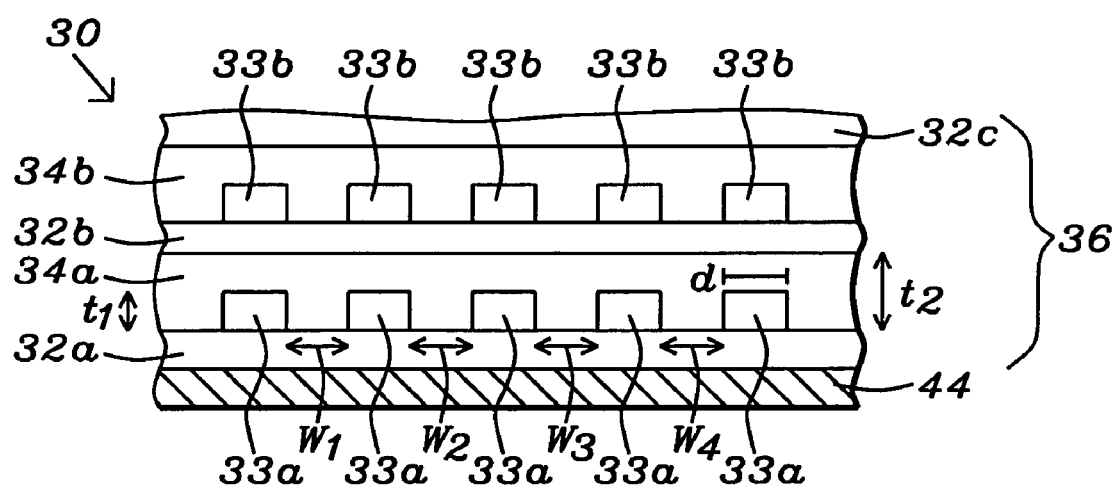
FIG. 7 is an enlarged view of a portion of FIG. 6.

Referring to FIG. 7, an enlarged view of a portion of the second super-paramagnetic cladding layer 36 in FIG. 6 is depicted. For example, the drawing in FIG. 7 may represent a portion of the second super-paramagnetic cladding layer 36 disposed on the top surface of the second conductive line 44. In the exemplary embodiment, the second super-paramagnetic cladding layer 36 has essentially the same composition and same thickness as the first super-paramagnetic cladding layer 35. Preferably, the second super-paramagnetic cladding layer 36 is comprised of a plurality of "y" ML/SL stacks wherein y is an integer between about 5 and 50, ML is a soft magnetic layer comprised of discontinuous particles with a thickness and diameter of about 2 nm or less that are separated and covered by a capping layer, and SL is a seed layer that is preferably an oxide such as $AlO_x$. Note that "y" is not necessarily equal to "x". Moreover, one or more of the ML/SL stacks in the second super-paramagnetic cladding layer 36 may have a different composition and/or thickness than the ML/SL stacks in the first super-paramagnetic cladding layer 35. In an alternative embodiment, one or more of the ML/SL stacks in the second super-paramagnetic cladding layer 36 may differ from each other in terms of thickness and/or composition.

One advantage of the present invention is that the soft magnetic layers 33a, 33b, etc., are thinner than in prior art and thereby allow a more uniform super-paramagnetic character in the cladding layers 35, 36 which in turn leads to a more uniform switching behavior of the MTJ 42. The thickness and composition of the cladding layers 35, 36 may be individually tuned in order to optimize the performance of the MRAM cell. Since the super-paramagnetic cladding layers of the present invention are made of ferromagnetic materials with near zero magnetostriction and very low anisotropy, they have very high susceptibility which can significantly reduce switching currents.

The present invention is also a method of forming the previously described super-paramagnetic cladding layers. Referring to FIG. 4, the dielectric layer 31 may be made of silicon oxide or a low k dielectric material that is deposited by a CVD or PECVD technique, for example. A trench 45 is fabricated by a conventional method. The super-paramagnetic cladding layer 35 is laid down on the dielectric layer 31 by depositing the first seed layer 32a using a reactive sputtering process such as a CVD, PECVD, or PVD method. When the first seed layer 32a is $AlO_x$, an Al film may be first deposited by a reactive sputtering process followed by oxidation using a well known plasma, radical (ROX), or natural oxidation method. Thereafter, the soft magnetic layer 33a may be formed by a magnetron sputtering process using a combination of the appropriate metal targets such as Ni and Fe, Co and Fe, or Co, Ni, and Fe. Alternatively, the soft magnetic layer 33a is formed by a CVD, PECVD, PVD, or IBD technique. During the deposition of the soft magnetic layer 33a, substrate heating in a temperature range of 80° C. to 200° C. may help with the formation of the discontinuous particles on the seed layer 32a.

Next, the capping layer 34a is deposited on the soft magnetic layer 33a and on the first seed layer 32a by a CVD, PECVD, PVD, or IBD method known to those skilled in the art. The sequence of steps employed to form the layers 32a, 33a, 34a in the first ML/SL stack is repeated a plurality of "x" times until the required thickness of the first super-paramagnetic cladding layer 35 is achieved. Optionally, a diffusion barrier layer (not shown) comprised of TaN, TiN or the like is deposited on the first super-paramagnetic cladding layer 35. An electroplating or IBD method may be used to deposit the first conductive line 41 on the super-paramagnetic cladding layer 35 (or diffusion barrier layer) and fill the trench 45. Those skilled in the art will appreciate that a chemical mechanical polish process may be employed to form a first conductive line 41 and super-paramagnetic cladding layer 35 that are essentially coplanar with the dielectric layer 31.

A well known process sequence may then be followed to form an MTJ 42 on the first conductive line 41 and a dielectric layer 43 coplanar with the MTJ. A second trench is formed by a conventional method within a third dielectric layer (not shown) on the dielectric layer 43. In one embodiment, a second conductive line 44 is deposited in the second trench and the second super-paramagnetic layer 36 is deposited on the second conductive line using a process similar to that described for forming the first super-paramagnetic cladding layer 35. Optionally, a second diffusion barrier layer (not shown) may be formed on the sidewalls and bottom of the second trench before depositing the second super-paramagnetic cladding layer 36 and the second conductive line 44.

Referring to FIG. 6, the second super-paramagnetic cladding layer 36 may be formed on three sides of the second conductive line 44 that are not adjacent to the MTJ 42. Optionally, a second diffusion barrier layer (not shown) may be formed between the sides of the second conductive line that are perpendicular to the substructure 40 and the portion of the second super-paramagnetic cladding layer 36 that abuts the sidewalls of the second trench 47. In yet another embodiment, the second super-paramagnetic cladding layer 36 is formed only on the two sides of the second conductive line 44 that are perpendicular to the substructure 40. Again, a process sequence similar to that described for the first super-paramagnetic cladding layer 35 may be employed to deposit the second super-paramagnetic cladding layer 36.

The advantages of the present invention are that fringing fields and hysteresis effects associated with continuous or semi-continuous ferromagnetic cladding films in the prior art are totally eliminated because of the discontinuous particles less than about 2 nm thick in the soft magnetic layer. Furthermore, the super-paramagnetic cladding layers of the present invention can be easily fabricated with well controllable and uniform magnetic properties and with high thermal stability, and high permeability which is highly desirable for a magnetic cladding function.

While this invention has been particularly shown and described with reference to, the preferred embodiment thereof, it will be understood by those skilled in the art that various changes in form and details may be made without departing from the spirit and scope of this invention.

We claim:

1. A super-paramagnetic cladding layer comprised of a plurality of ML/SL stacks formed adjacent to at least one side of a conductive line in a magnetic device in which said at least one side does not contact a sensor element and each ML/SL stack is comprised of:

(a) a lower seed layer (SL); and
   (b) an upper ML layer which is a composite comprised of a soft magnetic layer having a first thickness and made of discontinuous particles formed on the SL layer and a conductive capping layer formed on the soft magnetic layer and on the SL layer between the discontinuous particles, said conductive capping layer is comprised of Ru or Cu and has a second thickness greater than said first thickness.

2. The super-paramagnetic cladding layer of claim 1 wherein the magnetic device is an MRAM, the sensor element is an MTJ, and the conductive line is a word line, bit line, digit line, data line, column line, or row line.

3. The super-paramagnetic cladding layer of claim 1 wherein said seed layer is comprised of amorphous $AlO_x$ or another amorphous oxide with a thickness from about 0.8 to 10 nm.

4. The super-paramagnetic cladding layer of claim 1 wherein the soft magnetic layer is comprised of a soft magnetic alloy with near zero magnetostriction.

5. The super-paramagnetic cladding layer of claim 4 wherein the soft magnetic layer has a thickness less than about 2 nm and is comprised of NiFe having a Ni content of about 80 atomic % ($Ni_{\sim 80}Fe_{\sim 20}$), NiFe having a Ni content of about 30 atomic % ($Ni_{\sim 30}Fe_{\sim 70}$), CoFe having a Co content of about 90 atomic % ($Co_{\sim 90}Fe_{\sim 10}$), or combinations thereof.

6. The super-paramagnetic cladding layer of claim 1 wherein the soft magnetic layer is super para-magnetic at a temperature above $-30°$ C.

7. The super-paramagnetic cladding layer of claim 1 wherein the conductive capping layer is about 0.5 to 5 nm thick.

8. The super-paramagnetic cladding layer of claim 1 wherein said super-para-magnetic cladding layer is comprised of about 5 to 50 ML/SL stacks.

9. The super-paramagnetic cladding layer of claim 1 wherein a SL and/or ML layer in a first ML/SL stack has a different composition and/or thickness than a SL or ML layer, respectively, in a second ML/SL stack.

10. The super-paramagnetic cladding layer of claim 1 wherein the substrate is a dielectric layer and/or said conductive line.

11. An MRAM structure, comprising:

(a) a first conductive line for passing a current therethrough to generate a magnetic field for switching a magnetic orientation of a free layer in an adjacent MTJ having a top surface and a bottom surface, said first conductive line has four sides including a side that contacts the bottom surface of said MTJ;

(b) a second conductive line for passing a current therethrough to generate a magnetic field for switching the magnetic orientation of the free layer in said MTJ, said second conductive line is aligned orthogonal to the first conductive line and has four sides including a side that contacts the top surface of said MTJ; and (c) a super-paramagnetic cladding layer formed on at least one side of the first conductive line and/or second conductive line wherein said at least one side does not contact said MTJ and wherein said super-paramagnetic cladding layer is comprised of a plurality of ML/SL stacks in which SL is a seed layer formed on a substrate, and ML is a composite comprised of a soft magnetic layer made of discontinuous particles on the seed layer and a conductive capping layer formed on the soft magnetic layer and on the seed layer between the discontinuous particles, said soft magnetic layer has a first thickness and said capping layer is comprised of Ru or Cu and has a second thickness greater than the first thickness.

12. The MRAM structure of claim 11 wherein the first conductive line is a word line, bit line, digit line, data line, column line, or row line and is formed in a trench within a dielectric layer.

13. The MRAM structure of claim 11 wherein said seed layer is comprised of amorphous $AlO_x$ or another amorphous oxide with a thickness between about 0.8 and 10 nm.

14. The MRAM structure of claim 11 wherein the soft magnetic layer is comprised of a soft magnetic alloy with near zero magnetostriction.

15. The MRAM structure of claim 14 wherein the soft magnetic layer has a thickness less than about 2 nm and is comprised of NiFe having a Ni content of about 80 atomic % ($Ni_{~80}Fe_{~20}$), NiFe having a Ni content of about 30 atomic % ($Ni_{~30}Fe_{~70}$), CoFe having a Co content of about 90 atomic % ($Co_{~90}Fe_{~10}$), or combinations thereof.

16. The MRAM structure of claim 11 wherein the soft magnetic layer is super-para-magnetic at a temperature above −30° C.

17. The MRAM structure of claim 11 wherein the conductive capping layer is about 0.5 to 5 nm thick.

18. The MRAM structure of claim 11 wherein a plurality of ML/SL stacks is defined as between about 5 and 50 ML/SL stacks.

19. The MRAM structure of claim 11 wherein said super-paramagnetic cladding layer is comprised of an SL and/or ML layer in a first ML/SL stack that differs in composition and/or thickness from an SL and/or ML layer, respectively, in a second ML/SL stack.

20. The MRAM structure of claim 11 wherein a first super-paramagnetic cladding layer is formed on the first conductive line and a second super-paramagnetic cladding layer is formed on the second conductive line and the first super-paramagnetic cladding layer has a thickness and composition essentially the same as that of the second super-paramagnetic cladding layer.

21. A method of forming a super-paramagnetic layer adjacent to a conductive line in a magnetic device having a sensor element; comprising:
    (a) providing a substrate;
    (b) forming a seed layer (SL) on said substrate, said seed layer is formed by oxidation of a previously deposited metal layer;
    (c) forming a soft magnetic layer having a first thickness and comprised of discontinuous particles on said seed layer;
    (d) forming a conductive capping layer having a second thickness greater than said first thickness on said soft magnetic layer and on said seed layer between the discontinuous particles to complete a first ML/SL stack; and
    (e) repeating steps (b)-(d) a plurality of times to form a total of "x" ML/SL stacks.

22. The method of claim 21 wherein said magnetic device is an MRAM and said conductive line is a bit line, word line, digit line, data line, column line, or row line having four sides wherein one side is formed adjacent to a top surface or bottom surface of an MTJ in said MRAM, and said super-paramagnetic layer is formed on from one to three sides of the conductive line but not on the side adjacent to the MTJ.

23. The method of claim 22 wherein the substrate is the conductive line formed on the top surface of the MTJ.

24. The method of claim 22 wherein the substrate is a dielectric layer having a trench in which the conductive line will be formed following step (e) and said conductive line contacts the bottom surface of the MTJ.

25. The method of claim 24 wherein the magnetic device is further comprised of a second conductive line on the top surface of the MTJ and a second super-paramagnetic cladding layer is formed on the second conductive line but not on a side of the second conductive line that contacts the top surface of the MTJ.

26. The method of claim 21 wherein said seed layer is comprised of $AlO_x$ that is formed by a reactive sputtering of $AlO_x$ on said substrate or by first depositing an Al layer on the substrate and then oxidizing by a plasma, radical, or natural oxidation step.

27. The method of claim 21 wherein the soft magnetic layer is less than about 2 nm thick and is comprised of NiFe having a Ni content of about 80 atomic % ($Ni_{~80}Fe_{~20}$), NiFe having a Ni content of about 30 atomic % ($Ni_{~30}Fe_{~70}$), CoFe having a Co content of about 90 atomic % ($Co_{~90}Fe_{~10}$), or combinations thereof.

28. The method of claim 27 wherein the soft magnetic layer is deposited by a sputter deposition, CVD, PECVD, or IBD process.

29. The method of claim 21 wherein the conductive capping layer is comprised of Ru, Ta, or Cu and is formed by a sputter deposition, CVD, PVD, PECVD, or IBD process.

30. The method of claim 21 wherein "x" is between about 5 and 50 and the total thickness of the super para-magnetic cladding layer is about 10 to 150 nm.

31. The method of claim 21 wherein the conductive capping layer has a thickness between about 0.5 and 5 nm above the seed layer.

32. The method of claim 21 wherein the conductive capping layer has a substantially flat surface.

33. The method of claim 21 wherein the thickness and composition of a soft magnetic layer in a first ML/SL stack is different than that of a soft magnetic layer in a second ML/SL stack.

34. The method of claim 21 wherein the thickness and composition of a conductive capping layer in a first ML/SL stack is different than that of a conductive capping layer in a second ML/SL stack.

35. The method of claim 21 wherein said substrate is heated at a temperature between about 80° C. and 200° C. during the formation of a soft magnetic layer comprised of discontinuous particles.

* * * * *